(12) United States Patent
Mizuno

(10) Patent No.: US 6,992,504 B2
(45) Date of Patent: Jan. 31, 2006

(54) GENERAL-PURPOSE LOGIC ARRAY AND ASIC USING THE SAME

(75) Inventor: Masaharu Mizuno, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 215 days.

(21) Appl. No.: 10/385,697

(22) Filed: Mar. 12, 2003

(65) Prior Publication Data

US 2003/0173642 A1 Sep. 18, 2003

(30) Foreign Application Priority Data

Mar. 13, 2002 (JP) .............................. 2002-068425

(51) Int. Cl.
*H30K 19/177* (2006.01)
(52) U.S. Cl. .......................................... 326/41; 326/38
(58) Field of Classification Search ............ 326/37–41, 326/46–49, 101, 102; 716/16–18
See application file for complete search history.

(56) References Cited

U.S. PATENT DOCUMENTS

| 5,684,412 | A | 11/1997 | Yoeli et al. |
| 6,166,560 | A * | 12/2000 | Ogura et al. .................. 326/41 |
| 6,331,790 | B1 * | 12/2001 | Or-Bach et al. .............. 326/41 |
| 6,515,511 | B2 * | 2/2003 | Sugibayashi et al. ......... 326/41 |

FOREIGN PATENT DOCUMENTS

JP 11-238850 A 8/1999

* cited by examiner

*Primary Examiner*—Don Le
(74) *Attorney, Agent, or Firm*—Sughrue Mion, PLLC (57) ABSTRACT

A general-purpose logic cell array includes a plurality of cells and a lower wiring layer. The plurality of cells are formed on a substrate, and each of the plurality of cells includes a plurality of transistors. The lower wiring layer is formed above the plurality of cells, and which connects the plurality of transistors in each of the plurality of cells such that each of the plurality of cells has an elementary logic circuit. Information of the general-purpose logic cell array is provided to a user. The elementary logic circuits may be one of a gate circuit, a selector, an inverter and a flip-flop.

20 Claims, 7 Drawing Sheets

CELL-A

Fig. 4B

CELL-B

Fig. 4C

CELL-C

GENERAL-PURPOSE LOGIC ARRAY AND ASIC USING THE SAME

BACKGROUND OF THE INVENTION

1. Field of the Invention

The present invention relates a general-purpose logic cell array in which general-purpose logic cells are formed in an array, and an ASIC (Application Specific Integrated Circuit) using the same.

2. Description of the Related Art

Figure 1:
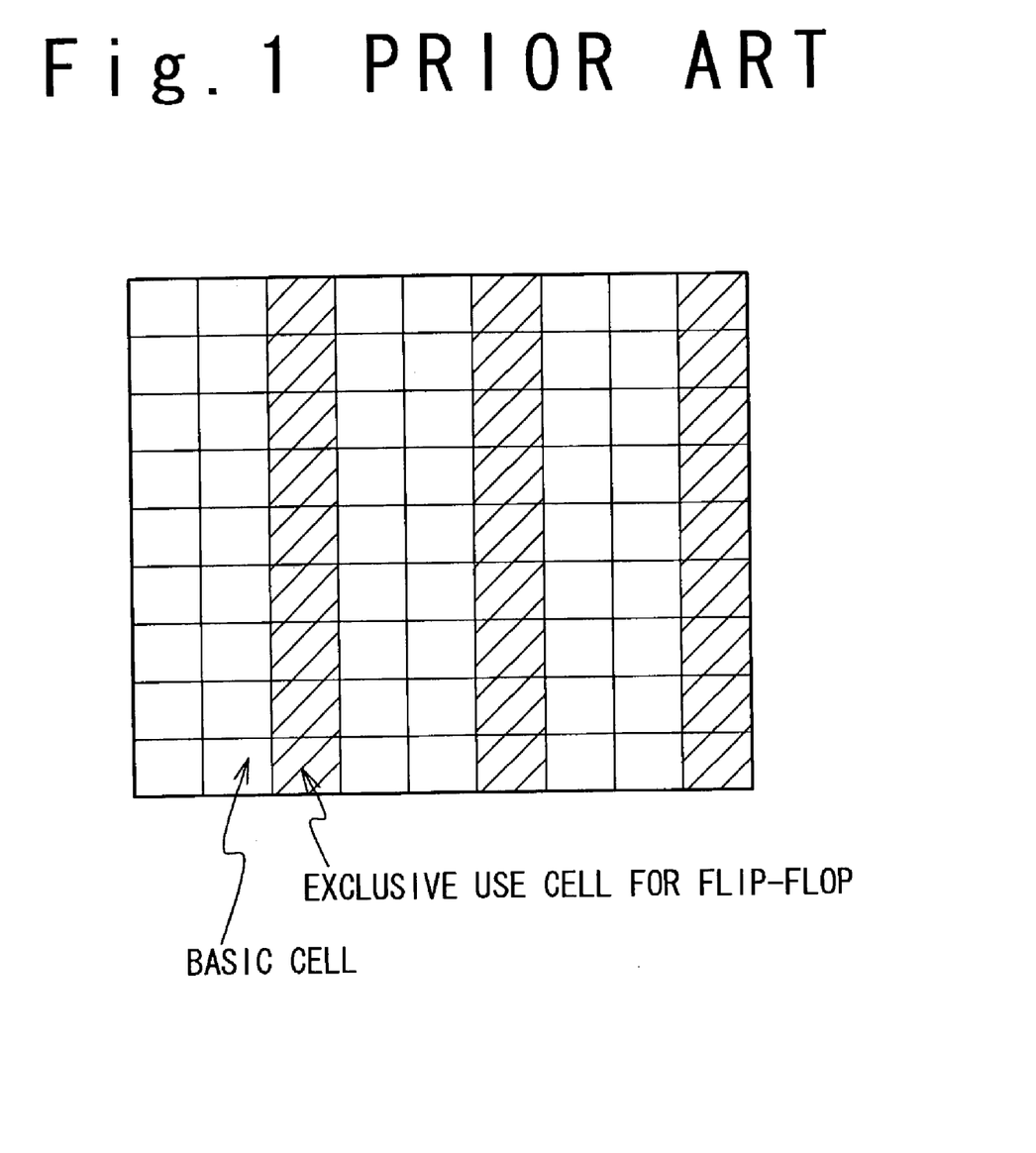
FIG. 1 is a diagram showing a first conventional cell array of a gate array type.

Conventionally, a cell array is known in which a plurality of cells are formed in a lower layer and arranged in an array. By forming a wiring layer for connecting the plurality of cells, a logic circuit with a desired function is formed. Thus, a semiconductor integrated circuit can be manufactured speedily. For example, Japanese Laid Open Patent Application (JP-A-Heisei 11-238850) discloses a cell array of a gate array type in which basic cells are arranged in an array. In this cell array, as shown in FIG. 1, basic cells are arranged in an array on a semiconductor substrate, and each of the basic cells has a plurality of transistors. Exclusive use cells for flip-flops are provided separately from the basic cells. In case that a logic circuit is formed using the cell array, the exclusive use cell is used for the flip-flop contained in the logic circuit. When the exclusive use cell is lack, a flip-flop is formed using the transistors of the basic cell.

In the cell array of the gate array type, a lower layer or a wafer with no wiring line layer is provided. The cells are connected in accordance with a pattern designed by a user and the logic circuit is manufactured.

Figure 2:
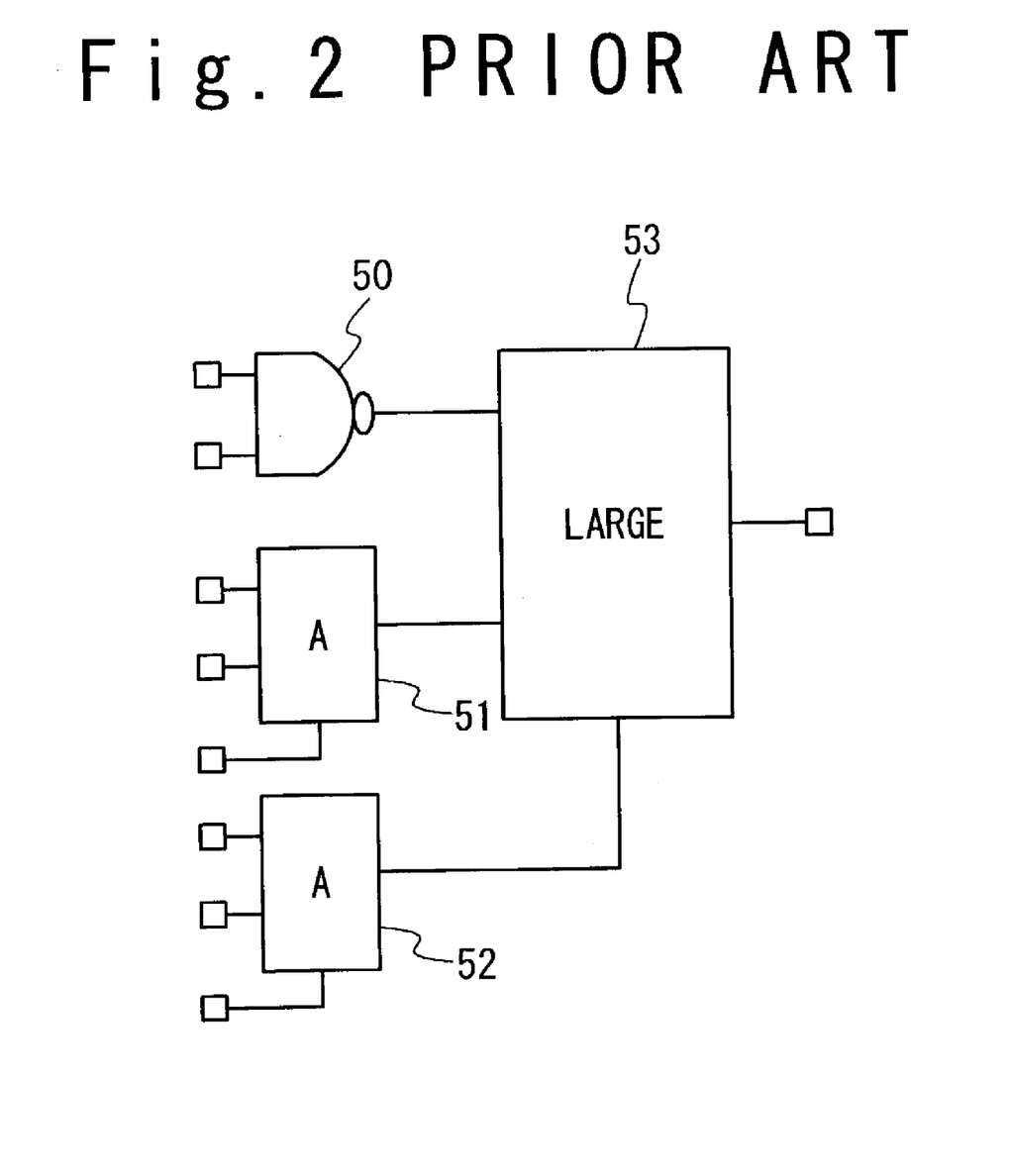
FIG. 2 is a diagram showing a second conventional cell array using general-purpose logic modules.

Also, a cell array is known in which cells of general-purpose logic modules such as a mask programmable functional block based gate array and general FPGA (Field Programmable Gate Array) are arranged in an array. For example, as such a cell array, U.S. Pat. No. 5,684,412 discloses "CELL FORMING PART OF A CUSTOMIZABLE ARRAY". The general logic module used in the cell array is composed of a NAND circuit 50, a 2-input multiplexer (A) 51, a 2-input multiplexer (A) 52, a 2-input multiplexer (LARGE) 53, as shown in FIG. 2. The general logic module is optimized such that an input capacity of an element of an input stage is small, and a drive capability of an element of an output stage is large.

As described above, the general-purpose logic module is a semiconductor integrated circuit in which basic circuits called general-purpose logic cells are formed in an array formed on a semiconductor substrate. The basic circuit is formed by electrically connecting MOS transistors in a general-purpose logic cell by a lower wiring line layer and a desired logic circuit is formed by electrically connecting the above general-purpose logic cells in the array by an upper wiring line layer. An ASIC (Application Specific Integrated Circuit) is manufactured using the general-purpose logic modules. The basic circuit is generally composed of a logic circuit having relatively small functions like an inverter circuit, a NAND circuit, a NOR circuit, or a multiplexer.

If the general-purpose logic modules are used, a wiring line pattern of the upper wiring line layer is designed to realize the desired logic circuit, and a lithography mask is formed using the wiring line pattern. Then, the upper wiring line layer is formed on the semiconductor substrate through a semiconductor manufacturing process to connect the general-purpose logic modules. Thus, a semiconductor chip with a desired logic circuit is formed.

The semiconductor substrate on which the general logic modules are formed is used as follows. For example, a semiconductor manufacturer opens to a user, the information of the semiconductor substrate. The user designs the desired logic circuit based on the opened information and requests the semiconductor manufacturer to manufacture a semiconductor chip to realize the desired logic circuit. The semiconductor manufacturer automatically designs the wiring line pattern of the upper wiring line layer based on the logic circuit received from the user and manufactures the semiconductor chip through the above mentioned process.

A cell array in which such a general logic module is used as a cell has a merit that a manufacturing term from the design of the logic circuit by the user to the completion of the semiconductor chip becomes short, compared with the cell array of above-mentioned gate array type.

However, the cell array disclosed in the above-mentioned Japanese Laid Open Patent Application (JP-A-Heisei 11-238850) is of a gate array type. Therefore, the basic cell as the lower layer is composed of transistors and only a diffusion region and gate regions are formed and wiring lines are not formed. When the logic circuit instructed from the user is formed using the cell array, it is necessary to carry out all the connections in the upper and lower wiring line layers, such as the wiring lines for the power and ground of the basic cell, and the wiring lines connecting between the basic cells. For this reason, the wiring line resource becomes bottom neck.

Also, in a cell array disclosed in the above-mentioned U.S. Pat. No. 5,684,412, a cell consisting of one kind of a general logic module is arranged in an array as the lower layer. A wiring line layer is formed on the lower layer to connect the general logic modules. Thus, a logic circuit instructed by the user is formed. For this reason, the wiring line resource to be used is few, compared with the cell array of the above-mentioned gate array method.

Also, in the general-purpose logic array, an optimization of the input stage and output stage of each general logic module is accomplished as described above. However, because only one kind of the general logic module exists, an optimization cannot be achieved from the viewpoints of the nature of the logic circuit instructed by the user, i.e., which of a combinational circuit, a sequential circuit and a drive circuit is most used. For this reason, when the logic circuit is formed by combining the general logic modules, the power consumption, the input capacity, and the drive ability and so on can not be optimized.

SUMMARY OF THE INVENTION

The present invention is accomplished to solve the above mentioned problems, and an object of the present invention is to provide a general-purpose logic cell array and an ASIC using the same, in which the wiring line resource neck can be solved and it can optimize the power consumption, input capacity, and ability to drive and so on.

In an aspect of the present invention, a general-purpose logic cell array includes a plurality of cells and a lower wiring layer. The plurality of cells are formed on a substrate, and each of the plurality of cells includes a plurality of transistors. The lower wiring layer is formed above the plurality of cells, and which connects the plurality of transistors in each of the plurality of cells such that each of the plurality of cells has an elementary logic circuit. Information of the general-purpose logic cell array is provided to a user.

Here, the elementary logic circuits may be one of a gate circuit, a selector, an inverter and a flip-flop.

Also, the plurality of cells are grouped into a plurality of groups based on an elementary logic function corresponding to the elementary logic circuit. The cells of each of the plurality of groups may be arranged in a first direction to form a row. In this case, the rows of the cells of the plurality of groups may be cyclically arranged in a second direction orthogonal to the first direction.

Also, it is desirable that the transistor connected to an input terminal of the elementary logic circuit has a smaller size and a smaller input capacitor than the transistor connected to an output terminal of the elementary circuit. In addition, it is desirable that the transistor connected to an output terminal of the elementary logic circuit has a larger size and a larger drive capability than the transistor connected to an input terminal of the elementary circuit.

In another aspect of the present invention, an ASIC includes a plurality of cells, a lower wiring layer and an upper wiring layer. The plurality of cells are formed on a substrate, and each of the plurality of cells includes a plurality of transistors. The lower wiring layer is formed above the plurality of cells, and which connects the plurality of transistors in each of the plurality of cells such that each of the plurality of cells has an elementary logic circuit. The upper wiring layer is formed above the lower wiring layer and which is used to connect the elementary logic circuits based on a logic function desired by a user. In this case, the elementary logic circuits may be one of a gate circuit, a selector, an inverter and a flip-flop.

Also, the plurality of cells are grouped into a plurality of groups based on an elementary logic function corresponding to the elementary logic circuit. The cells of each of the plurality of groups may be arranged in a first direction to form a row. In addition, the rows of the cells of the plurality of groups may be cyclically arranged in a second direction orthogonal to the first direction.

Also, it is desirable that the transistor connected to an input terminal of the elementary logic circuit has a smaller size and a smaller input capacitor than the transistor connected to an output terminal of the elementary circuit. In addition, it is desirable that the transistor connected to an output terminal of the elementary logic circuit has a larger size and a larger drive capability than the transistor connected to an input terminal of the elementary circuit.

In another aspect of the present invention, a method of manufacturing a general purpose logic cell array, is achieved by (a) forming on a substrate, a plurality of cells, each of which includes a plurality of transistors; and by (b) forming a lower wiring layer above the plurality of cells, to connect the plurality of transistors in each of the plurality of cells and to produce an elementary logic circuit in each of the plurality of cells. Information of the general-purpose logic cell array is provided to a user.

Here, the elementary logic circuits may be one of a gate circuit, a selector, an inverter and a flip-flop.

Also, the plurality of cells are grouped into a plurality of groups based on an elementary logic function corresponding to the elementary logic circuit. The (a) forming step may be achieved by arranging the cells of each of the plurality of groups in a first direction to form a row. In addition, the (a) forming step may be achieved by cyclically arranging the rows of the cells of the plurality of groups in a second direction orthogonal to the first direction.

Also, the (a) forming step may be achieved by forming each of the transistors in each of the plurality of cells such that the transistor connected to an input terminal of the elementary logic circuit has a smaller size and a smaller input capacitor than the transistor connected to an output terminal of the elementary circuit. In addition, the (a) forming step may be achieved by forming each of the transistors in each of the plurality of cells such that the transistor connected to an output terminal of the elementary logic circuit has a larger size and a larger drive capability than the transistor connected to an input terminal of the elementary circuit.

In another aspect of the present invention, a method of manufacturing an ASIC, is achieved by (a) forming the general purpose logic cell array on a substrate; by (b) informing a circuit structure of the general purpose logic cell array to a user; by (c) designing a layout of an upper wiring layer based on a logic function desired by a user; and by (d) forming the upper wiring layer above the lower wiring layer to connect-the elementary logic circuits based on the layout of the upper wiring layer.

Also, the (a) forming step may be achieved by (e) forming on a substrate, a plurality of cells, each of which includes a plurality of transistors; and by (f) forming a lower wiring layer above the plurality of cells, to connect the plurality of transistors in each of the plurality of cells and to produce an elementary logic circuit in each of the plurality of cells.

Here, the elementary logic circuits may be one of a gate circuit, a selector, an inverter and a flip-flop.

Also, the plurality of cells are grouped into a plurality of groups based on an elementary logic function corresponding to the elementary logic circuit. The (e) forming step may be achieved by arranging the cells of each of the plurality of groups in a first direction to form a row. In addition, the (e) forming step may be achieved by cyclically arranging the rows of the cells of the plurality of groups in a second direction orthogonal to the first direction.

Also, the (e) forming step may be achieved by forming each of the transistors in each of the plurality of cells such that the transistor connected to an input terminal of the elementary logic circuit has a smaller size and a smaller input capacitor than the transistor connected to an output terminal of the elementary circuit. Also, the (e) forming step may be achieved by forming each of the transistors in each of the plurality of cells such that the transistor connected to an output terminal of the elementary logic circuit has a larger size and a larger drive capability than the transistor connected to an input terminal of the elementary circuit.

DESCRIPTION OF THE PREFERRED EMBODIMENTS

Hereinafter, a general-purpose logic cell array and an ASIC using the same according to the present invention will be described in detail with reference to the attached drawings.

The general-purpose logic cell array according to an embodiment of the present invention is used to form a desired logic circuit, in which MOS transistors formed on a semiconductor substrate are electrically connected by a lower wiring line layer of, for example, three sub-layers to form a basic cell called a general-purpose logic cell in an array. The general-purpose logic cells are electrically connected by an upper wiring line layer of, for example, two sub-layers.

More specifically, the general-purpose logic cell array has the upper wiring line layer which is stacked on the basic cells through an interlayer insulating film, and the above basic cells are connected by the upper wiring line layer through through-holes formed in the interlayer insulating film. Thus, the general-purpose logic cells are formed in an array. In this specification, a semiconductor substrate that a plurality of transistors are formed in each of the basic cells and the wiring connection by the lower wiring line layer is completed is called a "lower constituent layer", and the lower constituent layer is provided from a semiconductor manufacturer.

The logic circuit instructed by the user is formed by stacking an interlayer insulating film on the lower wiring line layer and by connecting nodes provided for the general-purpose logic cells via through-holes formed in the interlayer insulating film by the upper wiring line. In this specification, a LSI (large-Scaled Integrated Circuit) as the logic circuit formed by connecting the nodes of the general-purpose logic cells by the upper wiring line layer is called "ASIC".

Figure 3:
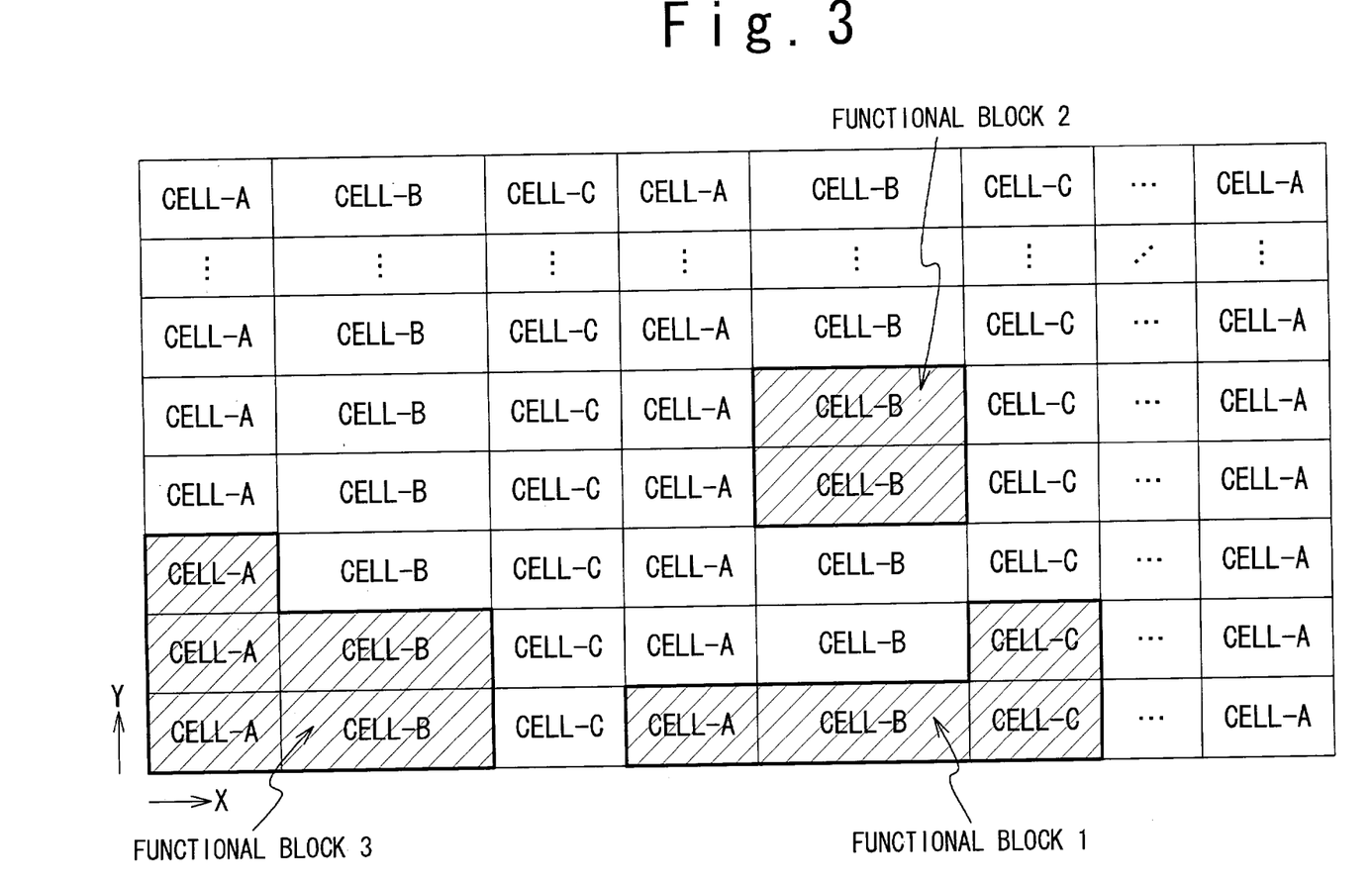
FIG. 3 is a diagram showing the structure of a general-purpose logic cell array according to an embodiment of the present invention.

FIG. 3 is a diagram showing the structure of the general-purpose logic cell array according to the embodiment of the present invention. The general-purpose logic cell array is composed of three kinds of logic cells such as a general-purpose logic cell CELL-A, a general-purpose logic cell CELL-B and a general-purpose logic cell CELL-C. Each of the general-purpose logic cell CELL-A, the general-purpose logic cell CELL-B and the general-purpose logic cell CELL-C is arranged in one line in the Y-direction. Also, the general-purpose logic cell CELL-A, the general-purpose logic cell CELL-B and the general-purpose logic cell CELL-Ct are cyclically arranged in this order in the X-direction.

It should be noted that in FIG. 3, an example of the general-purpose logic cell array is shown which is formed such that a ratio of the general-purpose logic cells CELL-A, the general-purpose logic cells CELL-B and the general-purpose logic cells CELL-C are CELL-A:CELL-B:CELL-C=1:1:1. However, the ratio can be optionally set.

Figure 4A:
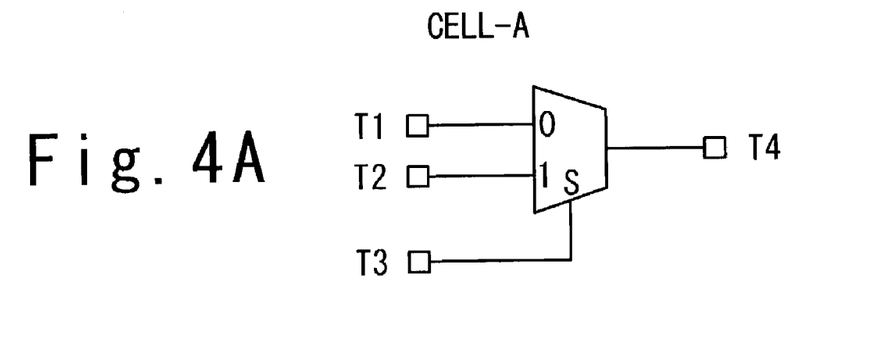
FIGS. 4A to 4C are circuit diagrams showing the structure of general-purpose logic cells used in the general-purpose logic cell array according to the embodiment of the present invention, respectively.

As shown in FIG. 4A, the general logic cell CELL-A is formed of a selector which has a node T1 connected with a first input terminal (0), a node T2 connected with a second input terminal (1), a node T3 connected with a selection input terminal (S) and a node T4 connected with an output terminal. The selector is formed by connecting a plurality of MOS transistors by the lower wiring line layer, although being not shown. Thus, the nodes T1 to T4 are connected with the lower wiring line layer. The MOS transistor with a relatively small size and a small input capacity is used for transistors of the first input terminal (0), the second input terminal (1) and the selection input terminal (S) of the selector. The MOS transistor with a relatively large size and a large drive ability is used for the transistor for the output terminal. Thus, the optimization of the selector is accomplished.

Figure 7:
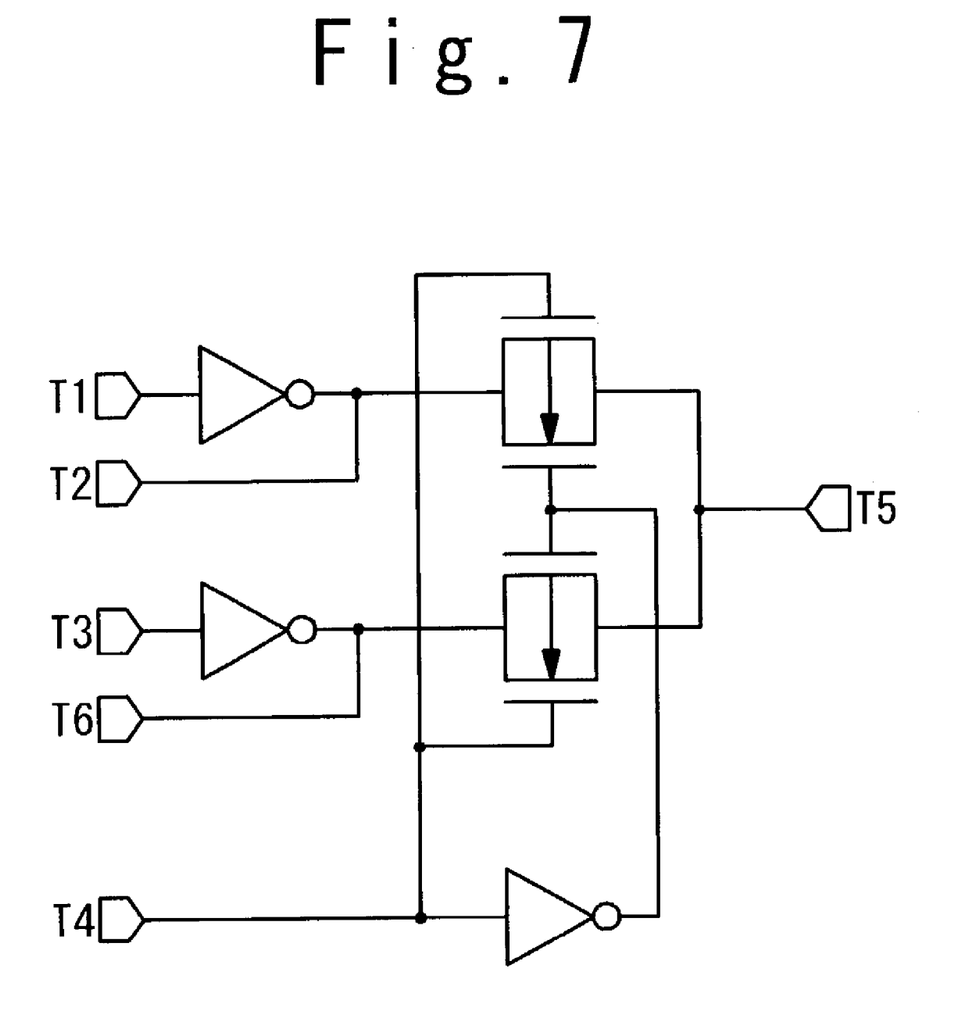
FIG. 7 is a circuit diagram showing a selector.

It should be noted that the selector disclosed by the applicant of the present invention in Japanese Patent Application No. 2000-349627 may be used as the general-purpose logic cell CELL-A. As shown in FIG. 7, the selector is composed of first to third inverters and first and second transfer gates. The outputs of the first and second inverters are connected to the first and second transfer gates. An external signal is supplied to different control terminals of the first and second transfer gates. Also, a signal obtained by inverting the external signal by the third inverter is supplied to different control terminals of the first and second transfer gates. The outputs of the first and second transfer gates are wired. In the selector, the outputs of the first and second inverters receiving are drawn out from the selector as a middle node. If the selector is used, there is an advantage that the high speed operating gate circuit can be formed by a few numbers of the wiring lines.

Figure 4B:
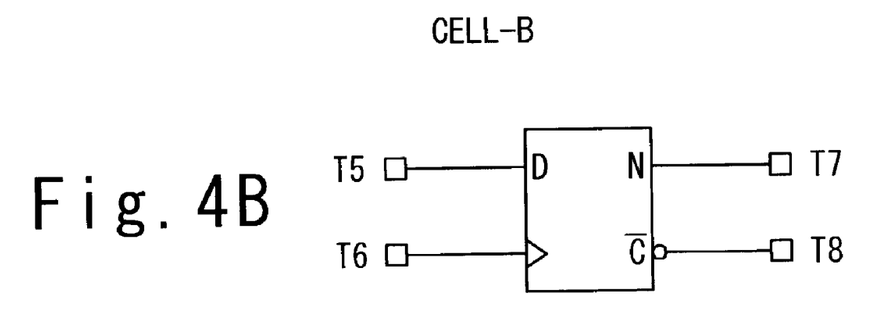

As shown in FIG. 4B, the general logic cell CELL-B is composed of a flip-flop which has a node T5 connected with a data input terminal (D), a node T6 connected with a clock input terminal, a node T7 connected with an output terminal (N) and a node T8 connected with an inverted output terminal (C). In the flip-flop, a plurality of MOS transistors are connected by the lower wiring line layer, although being not shown. Then, the nodes T5 to T8 are connected by the lower wiring line layer. The MOS transistor with a relatively small size and with a small input capacity is used for the transistor for the data entry terminal (D) of the flip-flop. The MOS transistor with a smaller size and with a further smaller input capacity is used for the transistor for the clock input terminal. The MOS transistor with a relatively large size and with a large ability to drive is used for the transistors for the output terminal (N) and the inverted output terminal (C). Thus, the flip-flop optimization is accomplished. The clock supplied to the flip-flop is a signal continuing to change. By decreasing the size of the MOS transistor supplied with the clock, the lower power consumption of the flip-flop can be realized.

Figure 4C:
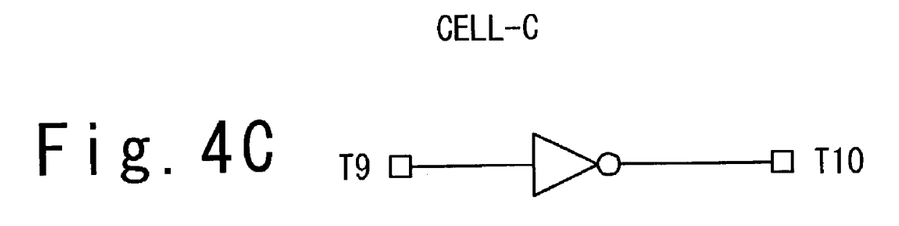

As shown in FIG. 4C, the general-purpose logic cell CELL-C is composed of an inverter which has a node T9 connected with the input terminal and a node T10 connected with the output terminal. The inverter is formed by connecting a plurality of MOS transistors by the lower wiring line layer although being not shown. Then, the nodes T9 and T10 are connected with the lower wiring line layer. The MOS transistor with a relatively small size and with a small input capacity is used as a transistor for the input terminal of the inverter. The MOS transistor with a large size and with a large drive ability is used as the transistor for an output terminal. Thus, the optimization of the inverter is accomplished.

Next, a designing system of the present invention will be described below.

Figure 6:
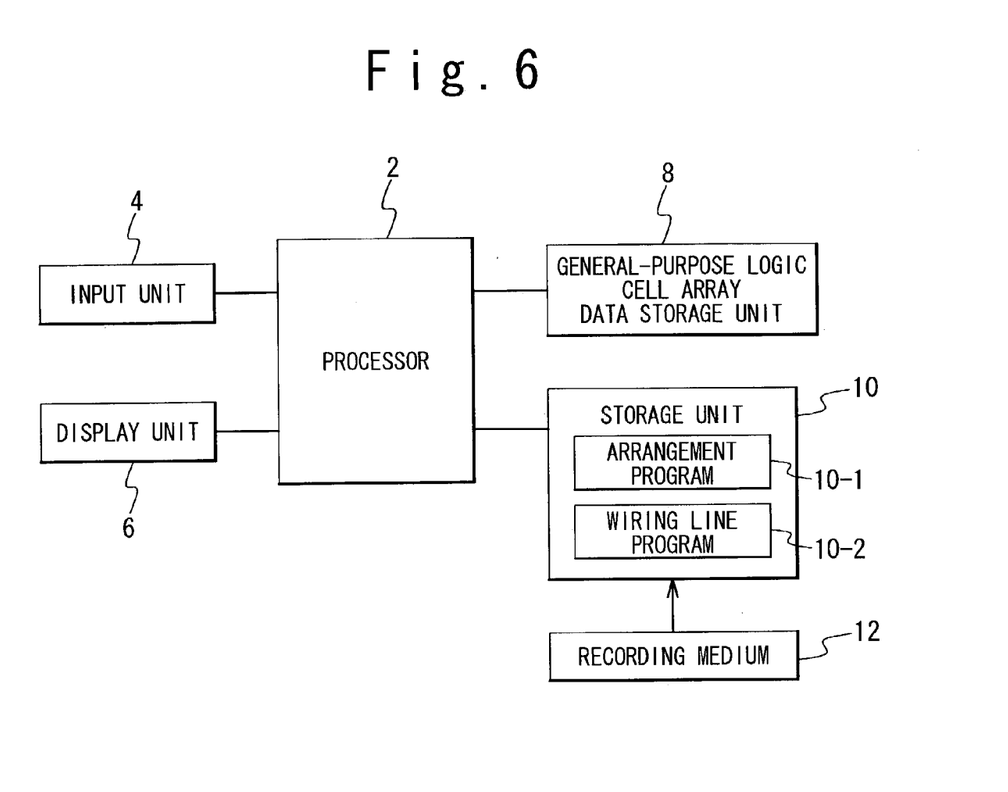
FIG. 6 is a block diagram showing the configuration of a designing system used for an ASIC designing.

The designing system is composed of a processor 2, an input unit 4, a display unit 6, a general-purpose logic cell data storage 8 and a storage unit 10 and a recording medium 12. An arrangement program and a wiring line program are loaded into the storage unit 10 from the recording medium 12. The storage unit 8 stores data of the general-purpose logic cell array, i.e., data of a layout and attributes of the MOS transistors in each of the logic cells, and a layout of connections of the MOS transistors in the lower wiring line layer. The processor 2 reads out the general-purpose logic cell array data from the storage unit 8 and provides it to a user automatically via the Internet or manually. When receiving data of a desired logic circuit from the user automatically via the Internet or manually, the processor 2 starts the arrangement program 10-1 and the wiring line program 10-2 to produce a layout of wiring lines for the upper wiring line layer.

Next, an ASIC using the above general-purpose logic cell array is manufactured in the following process.

For example, a lower constituent layer is formed of three kinds of general-purpose logic cells in an array on a semiconductor substrate, and each of the three kinds of general-purpose logic cells contains MOS transistors. By electrically connecting the MOS transistors by the lower wiring line layer of three sub-layers, the three kinds of general-purpose logic cells such as the general-purpose logic cell CELL-A, general-purpose logic cell CELL-B and general-purpose logic cell CELL-C are formed, as shown in FIG. 3. It should be noted that the lower wiring line layer is not limited to the three sub-layers and may be an optional number of sub-layers according to the structure of each general-purpose logic cell.

Figure 5:
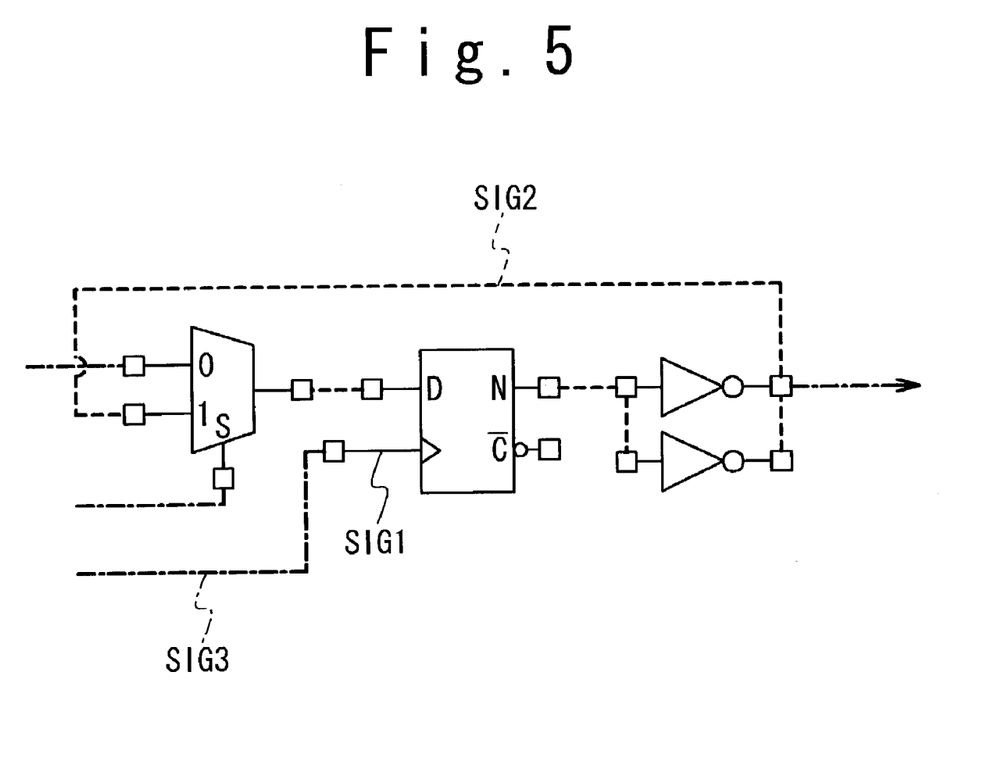
FIG. 5 is a functional block diagram showing an example of a functional block formed using the general-purpose logic cell array according to the embodiment of the present invention.

Next, the general-purpose logic cells are grouped based on a logic circuit instructed from a user to form functional blocks. A functional block 1 of one selector, one flip-flop and two inverters is supposed to be contained in the logic circuit instructed from the user, as shown in FIG. 5.

To realize the functional block 1, first, using an arrangement program, an arranging process of the general-purpose logic cells is carried out. In the arranging process, one selector, one flip-flop and two inverters are selected in an unused area of the general-purpose logic cell array. In this way, the one selector, one flip-flop and two inverters are grouped as the functional block 1 as shown in FIG. 3 by the slanted lines. Also, in the arranging process, a wiring line pattern in the functional block 1 connected in the upper wiring line layer is produced as shown in FIG. 5 by the broken line SIG2. Thus, the wiring line patter in the functional block is completed. It should be noted that the solid line SIG1 is a wiring line pattern in the general-purpose logic cell and is already connected by the lower wiring line layer.

In the same way, the general-purpose logic cells are grouped to realize the other functional block 2 and functional block 3 contained in the logic circuit instructed from the user. In the functional block 2, two flip-flops are grouped, and in the functional block 3, three selectors and two flip-flops are grouped and connected.

Next, a wiring line process is carried out using a wiring line program. That is, a wiring line pattern is produced to connect the nodes between the general-purpose logic cells in the upper wiring line layer, as shown in FIG. 5 by one chain line SIG3. Thus, the wiring line pattern between the functional blocks is completed. Using a lithography mask with the wiring line patterns produced in the arranging process and the wiring line process, a semiconductor manufacturing process is carried out to form the upper wiring line layer on the lower constituent layer through an interlayer insulating film. Thus, the semiconductor chip with the logic circuit instructed by the user is formed by the general-purpose logic cell array.

Also, when the ASIC is designed using the general-purpose logic cell array, the wiring line pattern of the upper wiring line layer is designed by carrying out the grouping and the connection in the above mentioned procedure, to realize the logic circuit instructed from the user. In this way, the design of ASIC completes. After that, using the lithography mask on which the designed wiring line pattern is formed, the semiconductor chip is manufactured through the semiconductor manufacturing process to have the logic circuit instructed by the user.

The ASIC using the general-purpose logic cell array is provided to the user through the following method. For example, the semiconductor manufacturer opens the information of the lower constituent layer to the user. The user designs a desired logic circuit based on the opened information and requests the semiconductor manufacturer to manufacture a semiconductor chip to realize the logic circuit. The semiconductor manufacturer automatically designs the wiring line pattern based on the logic circuit instructed from the user, and manufactures the semiconductor chip as described above, and provides it for the user.

As described above, according to the general-purpose logic cell array according to the embodiment of the present invention, it is sufficient to connect the nodes of the general-purpose logic cells by the upper wiring line layer formed above the lower constituent layer to realize the logic circuit instructed from the user. Therefore, the wiring line resource neck can be substantially improved because it is not necessary to carry out all the connections by the upper wiring line layer, unlike the cell array of the gate array method.

Also, the general-purpose logic cell array according to the embodiment of the present invention is composed of a plurality of kinds of general-purpose logic cells such as a selector, a flip-flop and an inverter. In addition, the general-purpose logic cell is optimized. Therefore, the optimization is automatically carried out from the viewpoint of the nature of the logic circuit instructed from the user, e.g., based on which of the combinational circuit, the sequential circuit and the drive circuit is used. Therefore, the power consumption, the input capacity, the drive ability can be optimized by combining a plurality of general-purpose logic cells appropriately to form the logic circuit.

It should be noted that when many general-purpose logic cells are driven by a signal like a clock signal, the drive ability is sometimes lack, even if the inverter is supposed to be optimized in the drive circuit of only one inverter. In such a case, because the drive ability can be improved by connecting two or more inverters in parallel as shown in FIG. 5, the drive ability can be easily optimized.

It should be noted that in the above-mentioned embodiment, a plurality of general-purpose logic cells are formed of a 2-input multiplexer, a flip-flop and an inverter. However, the present invention is not limited to them and the other various logic circuits can be used as the general-purpose logic cells.

Also, in the above-mentioned embodiment, the general-purpose logic cell array of only the plurality of kinds of general-purpose logic cells is described. However, for example, it is possible to put an analog circuit such as the PLL circuit and analog-to-digital converter, and a semiconductor element other than the general-purpose logic cells such as a CPU and a memory in a part of the area of the general-purpose logic cell array. According to such a structure, the ASIC can be manufactured in which very many functions are mounted on one semiconductor chip.

As described above in detail, according to the present invention, the wiring line resource neck can be eliminated, and the general-purpose logic cell array which can optimize power consumption, input capacity, drive ability, and the ASIC using the same can be provided. In the present invention, the general-purpose logic cells are connected by the upper wiring line layer formed above the lower constituent layer. For this reason, it is not necessary that all the connections are carried out by the upper wiring line layer, unlike the cell array of the gate array method.

Also, the power consumption, the input capacity, the drive ability can be optimized, because the general-purpose logic cell array is composed of a plurality of kinds of general-purpose logic cells. In addition, the optimization is automatically carried out from the viewpoint of the nature of the logic circuit instructed from the user.

What is claimed is:

1. A general purpose logic cell array comprising:
   a plurality of cells which are formed on a substrate, each of said plurality of cells including a plurality of transistors; and
   at least one first wiring layer which connects said plurality of transistors in each of said plurality of cells such that each of said plurality of cells has an elementary logic circuit,
   wherein said plurality of cells comprises a plurality of different types of elementary logic circuits, cells having the same elementary logic circuit are grouped together,
   wherein said plurality of cells are grouped into a plurality of groups based on an elementary logic function corresponding to said elementary logic circuit, and
   said cells of each of said plurality of groups are arranged in a first direction to form a row,
   wherein rows of said cells of said plurality of groups are cyclically arranged in a second direction orthogonal to said first direction.

2. A general purpose logic cell array comprising:
   a plurality of cells which are formed on a substrate, each of said plurality of cells including a plurality of transistors; and
   at least one first wiring layer which connects said plurality of transistors in each of said plurality of cells such that each of said plurality of cells has an elementary logic circuit,
   wherein said plurality of cells comprises a plurality of different types of elementary logic circuits, cells having the same elementary logic circuit are grouped together,
   wherein at least one transistor connected to an input terminal of said elementary logic circuit has a smaller size and a smaller input capacitor than at least one transistor connected to an output terminal of said elementary circuit.

3. A general purpose logic cell array comprising:
   a plurality of cells which are formed on a substrate, each of said plurality of cells including a plurality of transistors; and
   at least one first wiring layer which connects said plurality of transistors in each of said plurality of cells such that each of said plurality of cells has an elementary logic circuit,
   wherein said plurality of cells comprises a plurality of different types of elementary logic circuits, cells having the same elementary logic circuit are grouped together,
   wherein at least one transistor connected to an output terminal of said elementary logic circuit has a larger size and a larger drive capability than at least one transistor connected to an input terminal of said elementary circuit.

4. A general purpose logic cell array comprising:
   a plurality of cells which are formed on a substrate, each of said plurality of cells including a plurality of transistors; and
   at least one first wiring layer which connects said plurality of transistors in each of said plurality of cells such that each of said plurality of cells has an elementary logic circuit,
   wherein said plurality of cells comprises a plurality of different types of elementary logic circuits, cells having the same elementary logic circuit are grouped together,
   wherein the grouped cells are arranged in at least one linear array.

5. The general purpose logic cell array as in any one of claims 1, 2, 3 and 4, wherein said elementary logic circuits is one of a gate circuit, a selector, an inverter and a flip-flop.

6. An ASIC comprising:
   a plurality of cells which are formed on a substrate, each of said plurality of cells including a plurality of transistors;
   at least one first wiring layer which connects said plurality of transistors in each of said plurality of cells such that each of said plurality of cells has an elementary logic circuit; and
   at least one second wiring layer connecting said elementary logic circuits based on a logic function desired by a user,
   wherein said plurality of cells comprises a plurality of different types of elementary logic circuits, cells having the same elementary logic circuit are grouped together,
   wherein said plurality of cells are grouped into a plurality of groups based on an elementary logic function corresponding to said elementary logic circuit, and
   said cells of each of said plurality of groups are arranged in a first direction to form a row,
   wherein rows of said cells of said plurality of groups are cyclically arranged in a second direction orthogonal to said first direction.

7. An ASIC comprising:
   a plurality of cells which are formed on a substrate, each of said plurality of cells including a plurality of transistors;
   at least one first wiring layer which connects said plurality of transistors in each of said plurality of cells such that each of said plurality of cells has an elementary logic circuit; and
   at least one second wiring layer connecting said elementary logic circuits based on a logic function desired by a user,
   wherein said plurality of cells comprises a plurality of different types of elementary logic circuits, cells having the same elementary logic circuit are grouped together,
   wherein at least one transistor connected to an input terminal of said elementary logic circuit has a smaller size and a smaller input capacitor than at least one transistor connected to an output terminal of said elementary circuit.

8. An ASIC comprising:
   a plurality of cells which are formed on a substrate, each of said plurality of cells including a plurality of transistors;
   at least one first wiring layer which connects said plurality of transistors in each of said plurality of cells such that each of said plurality of cells has an elementary logic circuit; and
   at least one second wiring layer connecting said elementary logic circuits based on a logic function desired by a user,
   wherein said plurality of cells comprises a plurality of different types of elementary logic circuits, cells having the same elementary logic circuit are grouped together, wherein at least one transistor connected to an output terminal of said elementary logic circuit has a larger size and a larger drive capability than at least one transistor connected to an input terminal of said elementary circuit.

9. An ASIC comprising:
a plurality of cells which are formed on a substrate, each of said plurality of cells including a plurality of transistors;
at least one first wiring layer which connects said plurality of transistors in each of said plurality of cells such that each of said plurality of cells has an elementary logic circuit; and
at least one second wiring layer connecting said elementary logic circuits based on a logic function desired by a user,
wherein said plurality of cells comprises a plurality of different types of elementary logic circuits, cells having the same elementary logic circuit are grouped together,
wherein the grouped cells are arranged in at least one linear array.

10. The ASIC as in any one of claims 6, 7, 8 and 9, wherein said elementary logic circuits is one of a gate circuit, a selector, an inverter and a flip-flop.

11. A method of manufacturing a general purpose logic cell array, comprising the steps of:
(a) forming on a substrate, a plurality of cells, each of which includes a plurality of transistors; and
(b) forming a at least one first wiring layer to connect said plurality of transistors in each of said plurality of cells and to produce an elementary logic circuit in each of said plurality of cells,
wherein said plurality of cells comprises a plurality of different types of elementary logic circuits, cells having the same elementary logic circuit are grouped together,
wherein said plurality of cells are grouped into a plurality of groups based on an elementary logic function corresponding to said elementary logic circuit, and
said (a) forming step comprises the step of:
arranging said cells of each of said plurality of groups in a first direction to form a row,
wherein said (a) forming step comprises the step of:
cyclically arranging rows of said cells of said plurality of groups in a second direction orthogonal to said first direction.

12. A method of manufacturing a general purpose logic cell array, comprising the steps of:
(a) forming on a substrate, a plurality of cells, each of which includes a plurality of transistors; and
(b) forming a at least one first wiring layer to connect said plurality of transistors in each of said plurality of cells and to produce an elementary logic circuit in each of said plurality of cells,
wherein said plurality of cells comprises a plurality of different types of elementary logic circuits, cells having the same elementary logic circuit are grouped together,
wherein said (a) forming step comprises the step of:
forming each of said transistors in each of said plurality of cells such that at least one transistor connected to an input terminal of said elementary logic circuit has a smaller size and a smaller input capacitor than at least one transistor connected to an output terminal of said elementary circuit.

13. A method of manufacturing a general purpose logic cell array, comprising the steps of:
(a) forming on a substrate, a plurality of cells, each of which includes a plurality of transistors; and
(b) forming a at least one first wiring layer to connect said plurality of transistors in each of said plurality of cells and to produce an elementary logic circuit in each of said plurality of cells,
wherein said plurality of cells comprises a plurality of different types of elementary logic circuits, cells having the same elementary logic circuit are grouped together,
wherein said (a) forming step comprises the step of:
forming each of said transistors in each of said plurality of cells such that at least one transistor connected to an output terminal of said elementary logic circuit has a larger size and a larger drive capability than at least one transistor connected to an input terminal of said elementary circuit.

14. A method of manufacturing a general purpose logic cell array, comprising the steps of:
(a) forming on a substrate, a plurality of cells, each of which includes a plurality of transistors; and
(b) forming a at least one first wiring layer to connect said plurality of transistors in each of said plurality of cells and to produce an elementary logic circuit in each of said plurality of cells,
wherein said plurality of cells comprises a plurality of different types of elementary logic circuits, cells having the same elementary logic circuit are grouped together,
wherein the grouped cells are arranged in at least one linear array.

15. The method according to any one of claims 11, 12, 13 and 14, wherein said elementary logic circuits is one of a gate circuit, a selector, an inverter and a flip-flop.

16. A method of manufacturing an ASIC, comprising the steps of:
(a) forming a general purpose logic cell array comprising a plurality of cells on a substrate;
(b) forming at least one first wiring layer to provide a plurality of different types of elementary logic circuits, cells having the same elementary logic circuit are grouped together;
(c) designing a layout of at least one second wiring layer based on a logic function desired by a user; and
(d) forming said at least one second wiring layer to connect said elementary logic circuits based on said layout of said at least one second wiring layer,
wherein said (a) forming step comprises:
(e) forming said plurality of cells such that each of said plurality of cells includes a plurality of transistors; and
wherein said at least one first wiring layer formed in step (b) connects said plurality of transistors in each of said plurality of cells to produce an elementary logic circuit in each of said plurality of cells,
wherein said plurality of cells are grouped into a plurality of groups based on an elementary logic function corresponding to said elementary logic circuit, and
said (e) forming step comprises the step of:
arranging said cells of each of said plurality of groups in a first direction to form a row,
wherein said (e) forming step comprises the step of:
cyclically arranging rows of said cells of said plurality of groups in a second direction orthogonal to said first direction.

17. A method of manufacturing an ASIC, comprising the steps of:
- (a) forming a general purpose logic cell array comprising a plurality of cells on a substrate;
- (b) forming at least one first wiring layer to provide a plurality of different types of elementary logic circuits, cells having the same elementary logic circuit are grouped together;
- (c) designing a layout of at least one second wiring layer based on a logic function desired by a user; and
- (d) forming said at least one second wiring layer to connect said elementary logic circuits based on said layout of said at least one second wiring layer, wherein said (a) forming step comprises:
- (e) forming said plurality of cells such that each of said plurality of cells includes a plurality of transistors; and wherein said at least one first wiring layer formed in step (b) connects said plurality of transistors in each of said plurality of cells to produce an elementary logic circuit in each of said plurality of cells, wherein said (e) forming step comprises the step of:

forming each of said transistors in each of said plurality of cells such that at least one transistor connected to an input terminal of said elementary logic circuit has a smaller size and a smaller input capacitor than at least one transistor connected to an output terminal of said elementary circuit.

18. A method of manufacturing an ASIC, comprising the steps of:
- (a) forming a general purpose logic cell array comprising a plurality of cells on a substrate;
- (b) forming at least one first wiring layer to provide a plurality of different types of elementary logic circuits, cells having the same elementary logic circuit are grouped together;
- (c) designing a layout of at least one second wiring layer based on a logic function desired by a user; and
- (d) forming said at least one second wiring layer to connect said elementary logic circuits based on said layout of said at least one second wiring layer, wherein said (a) forming step comprises:
- (e) forming said plurality of cells such that each of said plurality of cells includes a plurality of transistors; and wherein said at least one first wiring layer formed in step (b) connects said plurality of transistors in each of said plurality of cells to produce an elementary logic circuit in each of said plurality of cells, wherein said (e) forming step comprises the step of:

forming each of said transistors in each of said plurality of cells such that at least one transistor connected to an output terminal of said elementary logic circuit has a larger size and a larger drive capability than at least one transistor connected to an input terminal of said elementary circuit.

19. A method of manufacturing an ASIC, comprising the steps of:
- (a) forming a general purpose logic cell array comprising a plurality of cells on a substrate;
- (b) forming at least one first wiring layer to provide a plurality of different types of elementary logic circuits, cells having the same elementary logic circuit are grouped together;
- (c) designing a layout of at least one second wiring layer based on a logic function desired by a user; and
- (d) forming said at least one second wiring layer to connect said elementary logic circuits based on said layout of said at least one second wiring layer, wherein the grouped cells are arranged in at least one linear array.

20. The method as in any one of claims 16, 17, 18 and 19, wherein said elementary logic circuits is one of a gate circuit, a selector, an inverter and a flip-flop.

* * * * *